United States Patent [19]

Hasty

[11] 3,859,180

[45] Jan. 7, 1975

[54] METHOD FOR ENCAPSULATING DISCRETE SEMICONDUCTOR CHIPS

[75] Inventor: Turner Elijah Hasty, Dallas, Tex.

[73] Assignee: Texas Instruments Incorporated, Dallas, Tex.

[22] Filed: Oct. 16, 1972

[21] Appl. No.: 298,117

Related U.S. Application Data

[62] Division of Ser. No. 104,316, Jan. 6, 1971, Pat. No. 3,739,462.

[52] U.S. Cl. .................................... 204/16, 204/15

[51] Int. Cl. .......................... C23b 5/48, C23b 7/00

[58] Field of Search ............. 29/590, 588, 589, 583, 29/577; 204/15, 38 E, 16

[56] References Cited

UNITED STATES PATENTS

| | | | |
|---|---|---|---|
| 3,383,760 | 5/1968 | Shwartzman | 29/580 |
| 3,453,722 | 7/1969 | Ramsey et al. | 29/577 |
| 3,590,479 | 7/1971 | Devries | 29/580 |
| 3,602,981 | 9/1971 | Kooi | 29/577 |

*Primary Examiner*—T. M. Tufariello
*Attorney, Agent, or Firm*—Harold Levine; James T. Comfort; William E. Hiller

[57] ABSTRACT

Disclosed is a method for encapsulating one or more discrete semiconductor chips to expose one surface thereof for metallization. The method includes forming a layer of a soft metal to overlie a relatively large substrate, pressing a surface of each discrete semiconductor chip into the soft metal and then encapsulating the semiconductor chip with suitable encapsulating material. The substrate and soft metal layer attached thereto are then removed from the encapsulated semiconductor chip exposing a surface of the chip. In one embodiment a heat sink is electroplated to the chip and the encapsulating material is removed, leaving a discrete semiconductor chip. In a different embodiment, the encapsulated semiconductor chip is utilized as a part of an integrated circuit.

6 Claims, 7 Drawing Figures

METHOD FOR ENCAPSULATING DISCRETE SEMICONDUCTOR CHIPS

Figure 1:
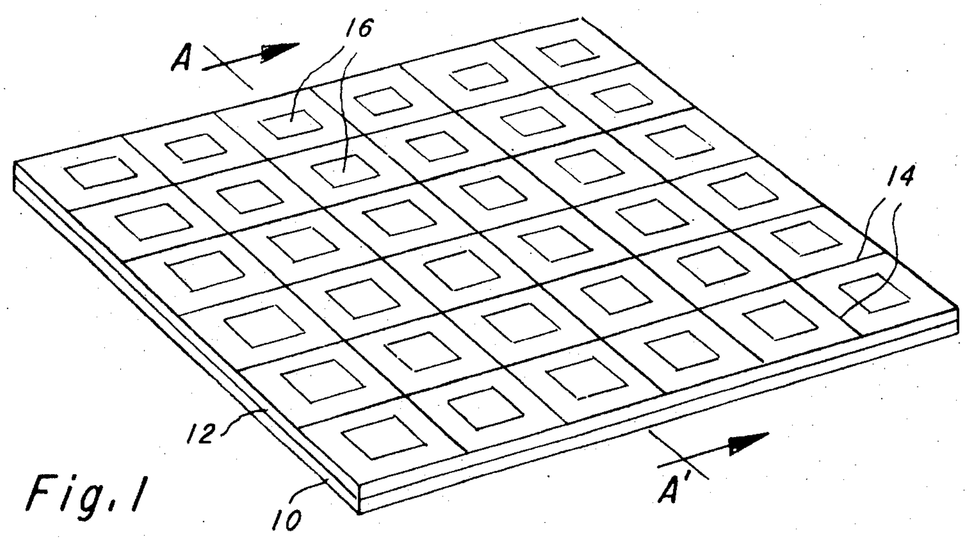

This is a division of application Ser. No. 104,316, filed Jan. 6, 1971, now U.S. Pat. No. 3,739,462.

This invention relates generally to semiconductor devices and, more specifically, to a method for encapsulating discrete semiconductor chips.

Many applications in the electronic industry require use of semiconductor devices, both discretely and as a part of integrated circuits. Since semiconductor devices are extremely sensitive to temperature variations, heat sinks are commonly bonded to the devices to dissipate heat. Various bonding techniques have been utilized in the industry. For example, thermal compression bonding and ultrasonic bonding methods have been employed. These methods, however, may physically damage the semiconductor device. This is particularly a problem with fragile semiconductor materials, such as gallium arsenide. Solder may be utilized to bond the semiconductor device to the heat sink but the solder forms a relatively poor thermal conductive bonding layer intermediate the device and the heat sink. In order to avoid the above-noted problems encountered in securing a heat sink to a semiconductor device, a plating technique has been proposed. In accordance with this method, a relatively large area of semiconductor material is utilized as a starting material such as, for example, a semiconductor slice 1½ to 2 inches in diameter and 50 mils in thickness. A relatively large area of semiconductor material is required since it is not feasible to electroplate to a small area such as a discrete chip. A relatively thick layer of a good thermal conductivity metal is electroplated to one surface of the semiconductor slice. However, to obtain devices having good thermal properties, a relatively large surface area of the electroplated heat sink is required for a relatively small area of the semiconductor material and, as a practical matter, only about 5 to 10 percent of the semiconductor material of the slice may be utilized. Consequently, the unwanted semiconductor material is removed utilizing mask and etching techniques, leaving "islands" of semiconductor material for device fabrication. Obviously, such a method of plating heat sinks to semiconductor devices wastes an extremely large amount of semiconductor material.

In addition, when the discrete device or chip is utilized as a part of an integrated circuit, other problems are encountered. For example, in conventional microwave integrated circuits lead inductances form a major problem since most microwave circuits are hybrid; that is, discrete devices are located on a substrate and are interconnected via lead wires. In this regard, a monolithic integrated circuit structure, which eliminates lead inductance, is extremely desirable. A difficulty with such a circuit, however, results from the fact that active semiconductor devices having widely divergent electrical characteristics, and sometimes even different semiconductor materials, are required for microwave circuits, and semiconductor devices having such characteristics cannot be formed on the same integrated circuit structure. Further, substrate materials of monolithic integrated circuits provide extremely poor heat sinks, resulting in a substantial waste of semiconductor material and reduction of power capabilities.

Accordingly, an object of the present invention is to provide an economical method for plating a heat sink to a discrete semiconductor chip.

A further object of the present invention is to provide a method for encapsulating a semiconductor chip leaving a surface exposed so that subsequent metallization may be accomplished.

An additional object of the present invention is to provide a method for fabricating a microwave integrated circuit having an optimum heat sink and also having the advantages associated with both monolithic and hybrid integrated circuits.

Briefly and in accordance with the present invention, a method is provided for encapsulating a discrete semiconductor chip leaving a surface thereof exposed such that subsequent metallization may be accomplished. In one embodiment, the discrete semiconductor chip is formed as a part of a microwave integrated circuit. The semiconductor chip or device is pressed into a layer of soft metal formed on the surface of a substrate, such as glass. The semiconductor chip is then encapsulated with a suitable material and the encapsulated semiconductor chip is then separated from the substrate and soft metal layer. A metal having high thermal conductivity is then electroplated to the exposed surface of the semiconductor chip and the adjacent encapsulating material thereby forming an optimum heat sink. The encapsulating material is then lapped to expose the top surface of the semiconductor chip and metallization is effected through a mask over the exposed top surface and adjacent encapsulating material to define a predetermined integrated circuit structure. Alternatively, a plurality of discrete semiconductor chips are pressed into the soft metal layer at spaced apart locations. The chips are then encapsulated with a suitable material. The encapsulated chips are separated from the soft metal layer and substrate, exposing a surface of each semiconductor chip. A heat sink is then plated over the exposed surfaces, the encapsulating material removed, and the structure is sliced to separate the discrete chips, thereby producing discrete semiconductor chips having optimum heat sinks plated to a surface thereof.

Figure 3:
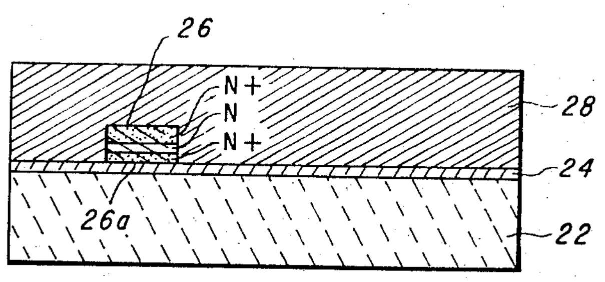
Figure 4:
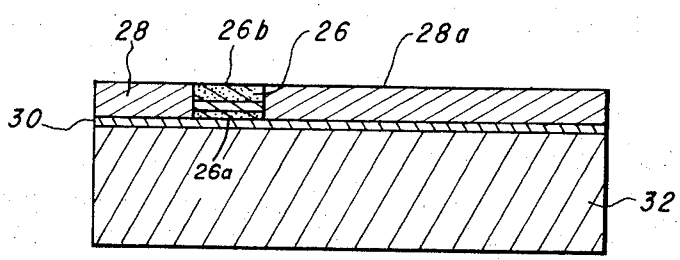
Figure 5:
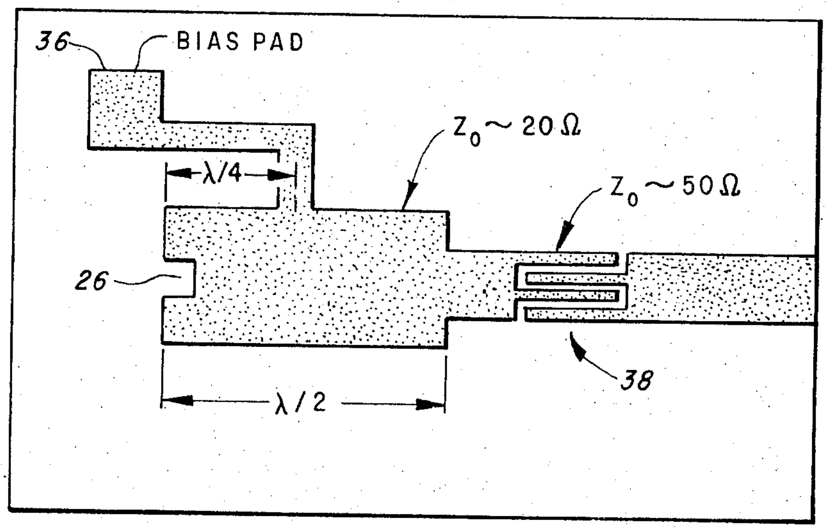

The novel features believed to be characteristic of this invention are set forth in the appended claims. The invention itself, however, as well as other objects and advantages thereof may best be understood by reference to the following detailed description of illustrative embodiments when read in conjunction with the accompanying drawings in which:

FIGS. 1 and 2_a_ through 2_c_ illustrate pictorially and in section various stages of the encapsulating method in accordance with the present invention;

FIGS. 3 and 4 are sectional views illustrating encapsulation of a discrete semiconductor device as a part of a microwave integrated circuit; and FIG. 5 diagrammatically depicts a microwave integrated circuit formed in accordance with the method of the present invention.

Referring now to the drawings and for the present particularly to FIGS. 1 and 2, there is illustrated an illustrative embodiment depicting the method of the present invention as it is utilized to encapsulate a discrete semiconductor chip, and to electroplate an optimum heat sink thereto.

Referring now specifically to FIG. 1, a substrate of any convenient size for handling is shown, generally at 10. Any substrate material adaptable to metallization with a soft metal, such as gold, indium or silver, may be utilized. Preferably the substrate is glass, such as a conventional microscope slide. A layer 12 of a soft metal is deposited to overlie the substrate 10. The metal 12 may, for example, be gold, silver or indium, although gold, deposited to a thickness of about 2,000 angstroms, is preferably used. The top layer of the soft metal 12 is partitioned by scribe lines shown generally at 14 to divide the top surface into a matrix of, for example, 30 mil squares. Discrete semiconductor chips, shown generally at 16, are placed in the center of each area of the matrix. The semiconductor chips 16 may, for example, be fabricated in a conventional way starting with a semiconductor slice and then partitioning that slice into separate discrete chips. Each chip may typically be 5 × 5 mils square and may be of any semiconductor material, such as silicon or gallium arsenide. Each semiconductor chip is pressed into the soft metal so that surface 16*a* of the chip is protected from contaminants during subsequent process steps. Each chip may be pressed only a few angstroms into the soft metal, the only requirement being that the surface be protected from contaminants during encapsulation.

Figure 2A:
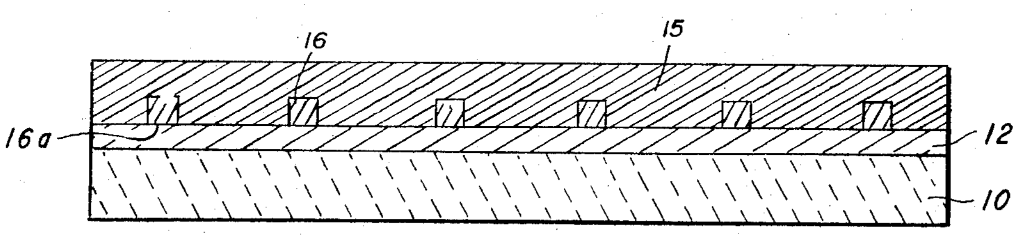
Figure 2B:
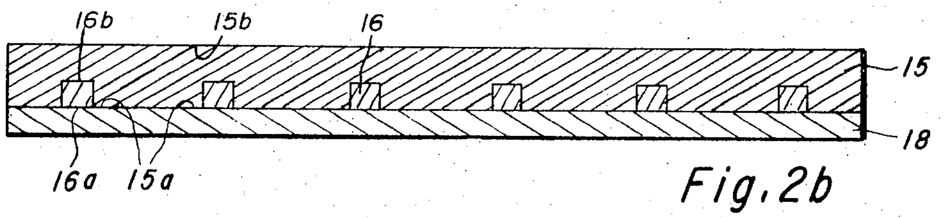
Figure 2C:
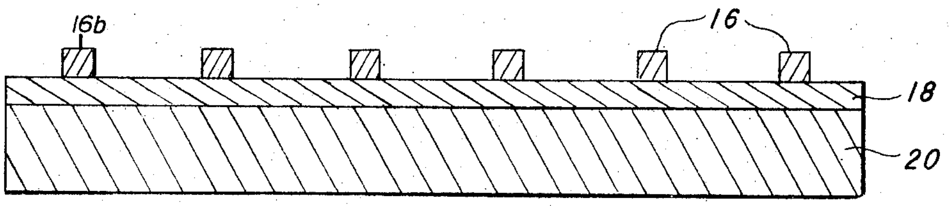

Referring now to FIGS. 2*a* through 2*c*, a sectional view along the line A—A′ of FIG. 1 is depicted illustrating subsequent processing steps of the present invention. A layer 15 of an encapsulating material is formed to enclose the semiconductor chips 16. Suitable encapsulants may, for example, comprise epoxy, waxes, plastics or casting resins. The substrate 10 and the soft metal layer 12 deposited thereon are then separated from the encapsulating material 15. As may be seen, the surface 16*a* of each semiconductor chip 16 is exposed for subsequent metallization. A layer 18 of an electrically and thermally conductive material such as nickel is next formed over the exposed surfaces 16*a* of the semiconductor chips 16 and the encapsulating material surface 15*a* adjacent thereto. Preferably the layer 18 also serves as a diffusion barrier layer between the exposed semiconductor chip and the high thermal conductivity metal subsequently to be electroplated to the structure. The layer 18 may be formed, for example, by vacuum deposition, electroless plating, sputtering, etc.. The structure at this point in the process is depicted in FIG. 2*b*.

In the next step, a layer 20 of high thermal conductivity material is electroplated to be in thermal contact with the exposed surfaces 16*a* of the semiconductor chips 16, the electrically conductive layer 18 forming one electrode for the electroplating process. Preferably, the material 20 is either copper or silver since these two materials may easily be electroplated and since they both are characterized as having a very high thermal conductivity. Thus, an optimum heat sink is formed to be in thermal contact with each of the semiconductor chips. If copper is utilized for the thermal conductive layer 20, the layer 18 must also serve as a diffusion barrier layer since copper diffuses very rapidly into semiconductor material such as gallium arsenide. The layer 20 may, for example, be electroplated to a thickness of from 10–15 mils. The encapsulant material 15 may then be removed with a suitable solvent such as trichloroethylene, toluene or acetone. The discrete semiconductor chips 16 (with optimum heat sinks plated thereto) may then be separated utilizing, for example, a conventional milling machine with a 4 mil slotting saw. It is to be noted that none of the semiconductor material is wasted since each semiconductor chip has associated therewith a relatively large surface area of thermal conductive material. That is, essentially all of the material of the original semiconductor slice is utilized in forming the discrete chips. These chips are then spaced apart on the layer of soft metal 12 by a sufficient distance so that each chip has the required amount of heat dissipating material in thermal contact therewith.

An alternative technique may also be utilized for effecting the electroplating of the layer 20. In this arrangement, surface 15*b* of the encapsulating material 15 is lapped to expose the top surface 16*b* of the semiconductor chips 16. Electroplating current is then applied through the individual semiconductor chips to effect the plating. This has the advantage of forming the thickest region of high thermal conductive material directly under each chip.

With reference now to FIGS. 3 and 4, fabrication of a microwave integrated circuit in accordance with the present invention will be described. A substrate, such as glass, of convenient size is shown at 22. A layer 24 of a soft metal such as gold or indium is deposited over the surface of the substrate 22. An active semiconductor device 26 is next pressed into the metal layer 24. By way of example, the device 26 is shown as comprising a Gunn device having an N+N N+ structure. While only one active device is depicted as being pressed into the layer 24, it is to be appreciated that any number of active devices formed of the same semiconductor material or different semiconductor material may be utilized as desired. Further, different kinds of devices, such as impact diodes, varactor miltiplier diodes, detector or mixer diodes, etc., may be included as a part of the integrated circuit. After a surface 26*a* of the device has been pressed into the soft metal layer 24, the device is encapsulated with a suitable casting resin 28 characterized by a relatively high dielectric constant and a thermal coefficient of expansion that is similar to that of the device 26. Preferably, the coefficients of thermal expansion are matched within 20 percent. One type of high dielectric constant casting resin that may be utilized in accordance with the present invention is identified as STYCAST HI K castable resin.

The substrate 22 and the layer 24 are separated from the device 26 and the adjacent casting resin 28, thereby exposing surface 26*a* of the semiconductor device. Preferably a layer of electrically conductive and diffusion blocking metal 30 is deposited over the exposed surface 26*a*. The layer 30 may, for example, comprise nickel which forms one electrode for the electroplating process. A layer 32 of high thermal conductivity material such as copper or silver is then plated to the semiconductor device. Alternatively, the casting resin 28 may be lapped to expose the top surface 26*b* of the semiconductor device and electroplating current passed therethrough to effect electroplating of the layer 32. In any event, after the thermoconductive layer 32 is plated to the device 26, the casting resin 28 is lapped to expose the top surface 26*b* of the semiconductor device. Any desirable integrated circuit may then be formed by metallization techniques on the top surface 26*b* of the device and the adjacent casting resin material surface 28*a*. Such a device is shown in FIG. 5.

With reference now specifically to FIG. 5, a microwave integrated circuit cavity oscillator is depicted. The Gunn device shown in FIGS. 3 and 4 is depicted at 26. Metallization has been accomplished through a mask to define the bias pad 36 and a d.c. block path in the region 38. The cavity oscillator integrated circuit is shown by way of example and any desired microwave integrated circuit may be formed in accordance with the method of the present invention.

As may be seen, the method for fabricating a microwave integrated circuit in accordance with the present invention produces several advantages. First of all, it provides the latitude of a hybrid integrated circuit in that discrete semiconductor chips having devices formed therein of widely different characteristics may be utilized. For example, one discrete semiconductor chip may be formed of gallium arsenide material while a separate chip may be formed of silicon. The advantages of a monolithic integrated circuit are also achieved in that the discrete semiconductor chips are interconnected in integrated circuit form thereby eliminating lead inductances. Additionally, the semiconductor chips are completely passivated on all surfaces and, most significantly, an optimum heat sink is plated to the integrated circuit thereby enabling much larger power handling capabilities. For example, a conventional gallium arsenide Gunn device has a thermal resistance of about 150°C/watt. A Gunn device fabricated in accordance with the present invention, on the other hand, has a thermal resistance in the range of only 10°C/watt.

While specific embodiments have been described herein, it will be apparent to a person skilled in the art that various modifications to the details of construction may be made without departing from the scope or spirit of the invention.

What is claimed is:

1. In a method of fabricating a semiconductor device the steps of:

a. forming a layer of a soft metal to overlie a substrate;

b. pressing a first surface of one or more discrete semiconductor chips into a region of said soft metal layer, said region being relatively large with respect to each of said discrete chips;

c. forming an encapsulating layer to overlie said one or more semiconductor chips and said region of said soft metal layer adjacent thereto;

d. separating said substrate and soft metal layer thereon from said encapsulated one or more semiconductor chips thereby exposing said first surface of each discrete chip; and e. bonding a relatively thick layer of thermal conductive metal to said exposed first surface of each of said discrete chips.

2. A method as set forth in claim 1 wherein said bonding step comprises:

a. depositing a relatively thin electrically conductive layer over said exposed first surface of each of said discrete chips; and b. electroplating a relatively thick layer of thermal conductive metal in thermal contact with said exposed first surface of each of said discrete chips, said electrically conductive layer forming one electrical terminal for said electroplating and also forming a diffusion barrier between said thermal conductive metal layer and said one or more semiconductor chips.

3. A method as set forth in claim 1 wherein said bonding step comprises:

a. lapping said encapsulated one or more chips to expose a second surface on each of said one or more semiconductor chips opposite said first surface thereof; and b. electroplating a relatively thick layer of thermal conductive metal to said first surface of each of said discrete chips, said second surface of each of said discrete chips forming an electrode for said electroplating, the electroplating current flowing through each of said semiconductor chips.

4. The method as set forth in claim 3 wherein said one or more semiconductor chips are GaAs and said thermal conductive metal is silver.

5. A method as set forth in claim 3 further including the step of forming a relatively thin diffusion barrier layer over said first surface prior to electroplating said thermal conductive metal layer.

6. A method as set forth in claim 5 wherein said relatively thin diffusion barrier layer is nickel, said one or more semiconductor chips are GaAs, said soft metal layer is gold, and said thermal conductive metal layer is copper.

* * * * *